(12) United States Patent
Shen et al.

(10) Patent No.: US 9,691,733 B1
(45) Date of Patent: Jun. 27, 2017

(54) BONDED SEMICONDUCTOR STRUCTURE AND METHOD FOR FORMING THE SAME

(71) Applicant: UNITED MICROELECTRONICS CORP., Hsin-Chu (TW)

(72) Inventors: Xu Yang Shen, Singapore (SG); Sin-Shien Lin, Taipei (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 15/221,609

(22) Filed: Jul. 28, 2016

(51) Int. Cl.
*H01L 23/00* (2006.01)
*H01L 25/065* (2006.01)
*H01L 25/00* (2006.01)

(52) U.S. Cl.
CPC .......... *H01L 24/83* (2013.01); *H01L 25/0657* (2013.01); *H01L 25/50* (2013.01); *H01L 2224/83895* (2013.01); *H01L 2224/83896* (2013.01); *H01L 2224/83948* (2013.01); *H01L 2924/0504* (2013.01)

(58) Field of Classification Search
CPC ...... H01L 24/83; H01L 25/0657; H01L 25/50
See application file for complete search history.

(56) References Cited

U.S. PATENT DOCUMENTS

| | | | | |
|---|---|---|---|---|
| 6,661,085 B2* | 12/2003 | Kellar | ..................... | H01L 25/50 257/686 |
| 7,323,781 B2* | 1/2008 | Noguchi | ............... | H01L 21/314 257/750 |
| 8,736,039 B2* | 5/2014 | Wu | ........................ | H01L 23/585 257/686 |
| 8,803,206 B1* | 8/2014 | Or-Bach | ............. | H01L 25/0657 257/278 |
| 9,165,974 B2* | 10/2015 | Kim | .................. | H01L 27/14609 |
| 9,230,941 B2 | 1/2016 | Chen et al. | | |
| 9,412,719 B2* | 8/2016 | Tsai | .................. | H01L 21/31111 |

* cited by examiner

*Primary Examiner* — William Coleman
(74) *Attorney, Agent, or Firm* — Winston Hsu

(57) ABSTRACT

A bonded semiconductor structure includes a first substrate and a second substrate. The first substrate includes a first interconnection structure, a first dielectric layer, and a first silicon carbon nitride (SiCN) layer sequentially stacked thereon. And at least a first conductive pad is formed in the first dielectric layer and the first SiCN layer. The second substrate includes a second interconnection structure, a second dielectric layer, and a second SiCN layer sequentially stacked thereon. And at least a second conductive pad is formed in the second dielectric layer and the second SiCN layer. The first conductive pad physically contacts the second conductive pad, and the first SiCN layer physically contacts the second SiCN layer.

9 Claims, 5 Drawing Sheets

BONDED SEMICONDUCTOR STRUCTURE AND METHOD FOR FORMING THE SAME

BACKGROUND OF THE INVENTION

1. Field of the Invention

The invention relates to a bonded semiconductor structure and a method for forming the same, and more particularly, to a bonded semiconductor structure and a method for forming the same using hybrid bonding.

2. Description of the Prior Art

The semiconductor industry continues to improve the integration density of various electronics components by reducing minimum feature size, which allows more components to be integrated into given areas. These smaller electronic components also require smaller packages that utilize less area than packages of the past, in some applications.

Three dimensional integrated circuits (3DICs) are therefore developed in semiconductor packaging in which multiple semiconductor dies are stacked upon one another, such as package-on-package (PoP), and system-in-package (SiP) packaging techniques. 3DICs provide improved integration density and other advantages, such as faster speeds and higher bandwidth, because of the decreased length of interconnects between the stacked dies, as examples.

Hybrid bonding is one type of bonding procedure for 3DICs. Once two semiconductor wafers are bonded together, the interface between two semiconductor wafers may provide an electrical connection between the bonded semiconductor wafers. However, it is found that hybrid bonding technique still has requirements of reducing leakage and improving bonding result.

SUMMARY OF THE INVENTION

According to an aspect of the present invention, a bonded semiconductor structure is provided. The bonded semiconductor structure includes a first substrate and a second substrate. The first substrate includes a first interconnection structure, a first dielectric layer, and a first silicon carbon nitride (hereinafter abbreviated as SiCN) layer sequentially stacked thereon. And at least a first conductive pad is formed in the first dielectric layer and the first SiCN layer. The second substrate includes a second interconnection structure, a second dielectric layer, and a second SiCN layer sequentially stacked thereon. And at least a second conductive pad is formed in the second dielectric layer and the second SiCN layer. The first conductive pad physically contacts the second conductive pad and the first SiCN layer physically contacts the second SiCN layer.

According to an aspect of the present invention, another bonded semiconductor structure is provided. The bonded semiconductor structure includes a first substrate including a first interconnection structure formed thereon, a second substrate including a second interconnection structure formed thereon, and a bonded structure formed in between the first interconnection structure of the first substrate and the second interconnection structure of the second substrate. The bonded structure includes a first dielectric layer, a second dielectric layer, a SiCN layer sandwiched in between the first dielectric layer and the second dielectric layer, and a bonded conductive material formed in the first dielectric layer, the SiCN layer and the second dielectric layer.

According to an aspect of the present invention, a method for forming a bonded semiconductor structure is provided. The method includes following steps: A first substrate including a first interconnection structure, a first dielectric layer, a first SiCN layer, and a patterned hard mask sequentially formed thereon is provided. Next, at least an opening is formed in the first SiCN layer and the first dielectric layer through the patterned hard mask layer. After forming the opening, the opening is filled with a conductive material and followed by planarizing the first substrate to remove the patterned hard mask layer and superfluous conductive material to form a first conductive pad in the first SiCN layer and the first dielectric layer and to expose the first SiCN layer. Thereafter, a second substrate including a second interconnection structure, a second dielectric layer formed on the second interconnection structure, and at least a second conductive pad formed in the second dielectric layer is provided. Then, the first substrate and the second substrate are bonded with the first conductive pad physically contacts the second conductive pad.

According to the method for forming the bonded semiconductor structure provided by the present invention, the SiCN layer must be remained and exposed after planarizing the first substrate. Therefore the bonding result is improved and, more important, leakage of the bonded conductive material which is formed by bonding the first conductive pad and the second conductive pad, is significantly reduced by the SiCN layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a method for forming a bonded semiconductor structure provided by a preferred embodiment of the present invention, wherein FIG. 2 is a schematic drawing in a step subsequent to FIG. 1 and is an partially enlarged view of FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIGS. 5 and 6, and is a partially enlarged view of FIGS. 5 and 6.

DETAILED DESCRIPTION

Figure 1:
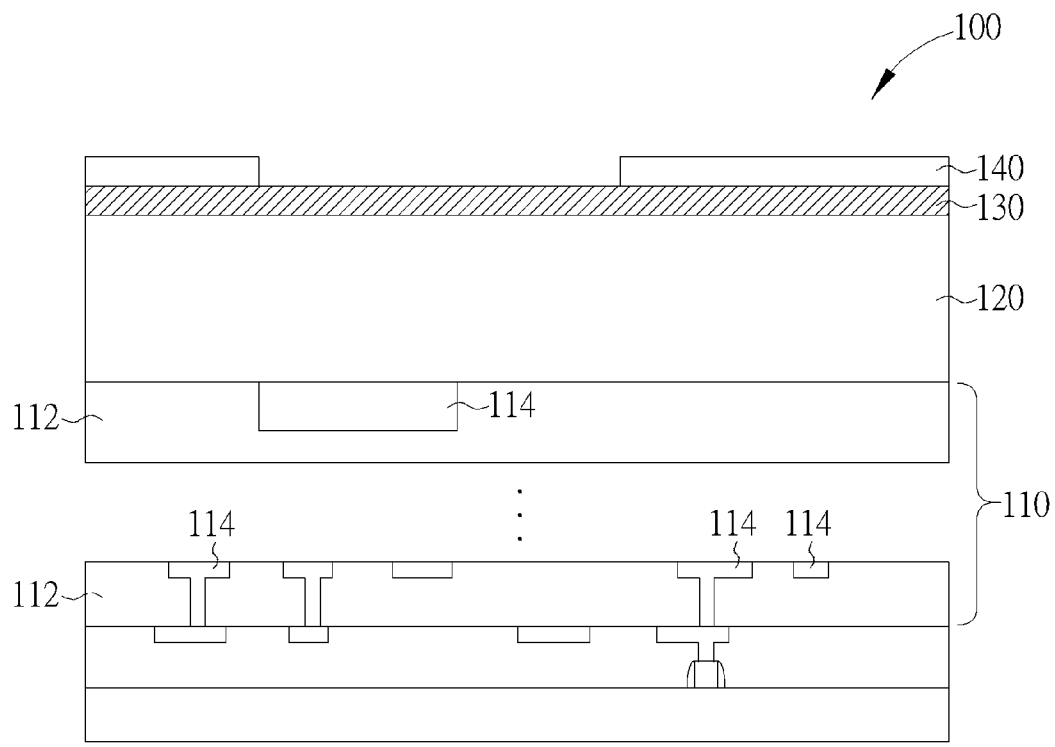

Please refer to FIGS. 1-7, which are drawings illustrating a method for forming a bonded semiconductor structure provided by a first preferred embodiment of the present invention. As shown in FIG. 1, a first substrate 100 is provided, and integrated circuit(s) including a plurality of active and passive devices (not shown) can be fabricated in the first substrate 100 by front-end-of-line (hereinafter abbreviated as FEOL) process. The first substrate 100 is typically a chip or die including a piece of a semiconductor wafer composed of a semiconductor material including, for example but not limited to, silicon (Si), silicon germanium (SiGe), a silicon-on-insulator (SOI) layer, and other like silicon-containing semiconductor materials. Device designs for the above mentioned active/passive devices and the details of the FEOL process are familiar to a person having ordinary skill in the art, therefore those details are all omitted in the interest of brevity.

Please refer to FIG. 1 again. The first substrate 100 further includes a first interconnection structure 110 formed thereon. The first interconnection structure 110 is formed on the first substrate 100 by back-end-of-line (hereinafter abbreviated as BEOL) process. The first interconnection structure 110 interconnects the active/passive devices of the integrated circuit(s) and may provide circuit-to-circuit connections, or may establish contacts with input and output terminals. As shown in FIG. 1, the first interconnection structure 110 includes a plurality of dielectric layers 112 such as interlayer dielectric layers or inter-metal dielectric (IMD) layers and a plurality of metal layers 114 (including wires and vias) formed in the dielectric layers 112. The dielectric layers 112 include, for example but not limited to, silicon oxide (SiO), silicon oxynitride (SiON), phosphosilicate glass (hereinafter abbreviated as PSG), borophosphosilicate (BPSG), fluorinated silicate glass (FSG), organosilicate glasses (OSG), silicon oxycarbide (SiOC), spin-on-glass, spin-on-polymers, silicon carbon material, compounds thereof, composites thereof, combinations thereof, or the like. The metal layers 114 include, also for example but not limited to, aluminum (Al) or copper (Cu). It is well-known to those skilled in the art that the first interconnection structure 110 is formed by steps of forming one dielectric layer 112, forming recesses (not shown) in the dielectric layer 112, and filling up the recesses with metal material such as Al or Cu to form the metal layers 114. These abovementioned steps can be repeated any number of times to form the stacked structure of the first interconnection structure 110.

Please still refer to FIG. 1. The first substrate 100 further includes a first dielectric layer 120, a first SiCN layer 130 and a patterned hard mask 140 sequentially formed thereon. Particularly, the first dielectric layer 120, the first SiCN layer 130 and the patterned hard mask 140 are formed on the first interconnection structure 110. The first dielectric layer 120 can include silicon oxide material such as, for example but not limited to, SiO, undoped silicon glass (USG), PSG, tetraethyl orthosilicate (TEOS), compounds thereof, composites thereof, combination thereof, or the like. In some embodiments of the present invention, the first dielectric layer 120 can include silicon nitride (SiN) or silicon oxynitride (SiON), but not limited to this. A thickness of the first dielectric layer 120 can be about 9000 angstroms (Å), but not limited to this. In the embodiment of the present invention, a thickness of the first SiCN layer 130 can be between 300 Å and 2000 Å, but not limited to this.

Figure 2:
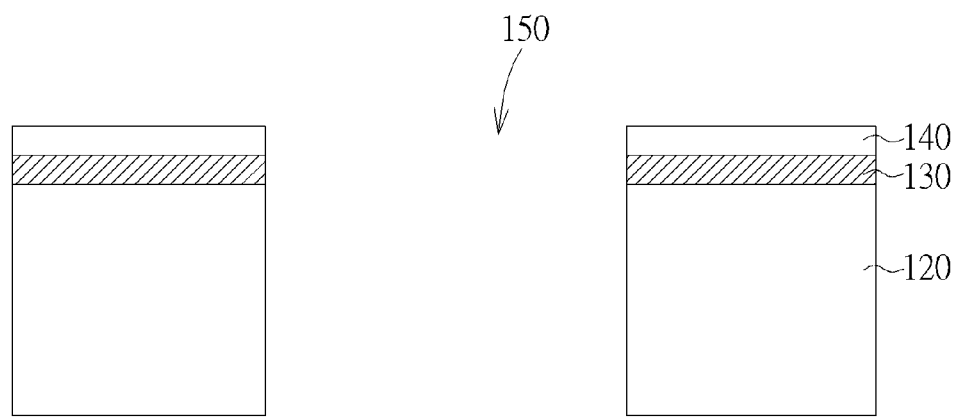

Please refer to FIG. 2, which is an enlarged view of the first dielectric layer 120, the first SiCN layer 130 and the patterned hard mask layer 140 in a step subsequent to FIG. 1. It is noteworthy that though other elements of the first substrate 100 such as the first interconnection structure 110 and the first substrate 100 are omitted in FIG. 2, those skilled in the art would easily realize the relationship between the omitted first substrate 100/first interconnection structure 110 and the first dielectric layer 120/first SiCN layer 130/patterned hard mask layer 140 according to FIG. 1. As shown in FIG. 2, at least an opening 150 is formed in the first SiCN layer 130 and the first dielectric layer 120 through the patterned hard mask layer 140. More important, although it is not depicted, those skilled in the art would easily realize that the opening 150 exposes the topmost metal layer of the first interconnection structure 110.

Figure 3:
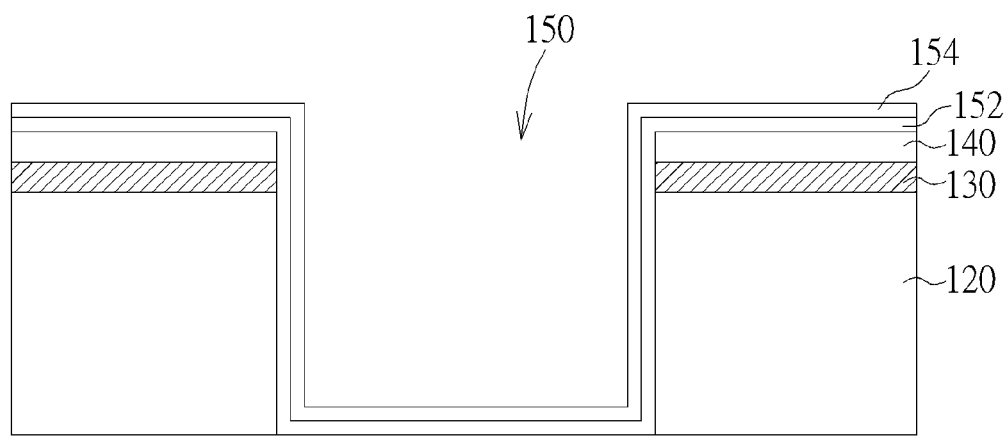

Please refer to FIG. 3. After forming the opening 150, a diffusion barrier layer 152 and a seed layer 154 are sequentially formed in the opening 150. The diffusion barrier layer 152, particularly the metal diffusion barrier layer, is formed to prevent metal from diffusion into the first dielectric layer 120, and thus to avoid problems such as electric leakage. In some embodiments of the present invention, the diffusion barrier layer 152 includes titanium nitride (TiN), tantalum nitride (TaN), or Ti/TiN, but not limited to this. Furthermore, for a Cu formation by a performing an electro chemical plating (ECP) process, a seed layer with low-resistivity is generally required. Thus, the seed layer 154 such as a Cu seed layer formed by, for example but not limited to, performing a physical vapor deposition (PVD) process is provided in the embodiments of the present invention as shown FIG. 3.

Figure 4:
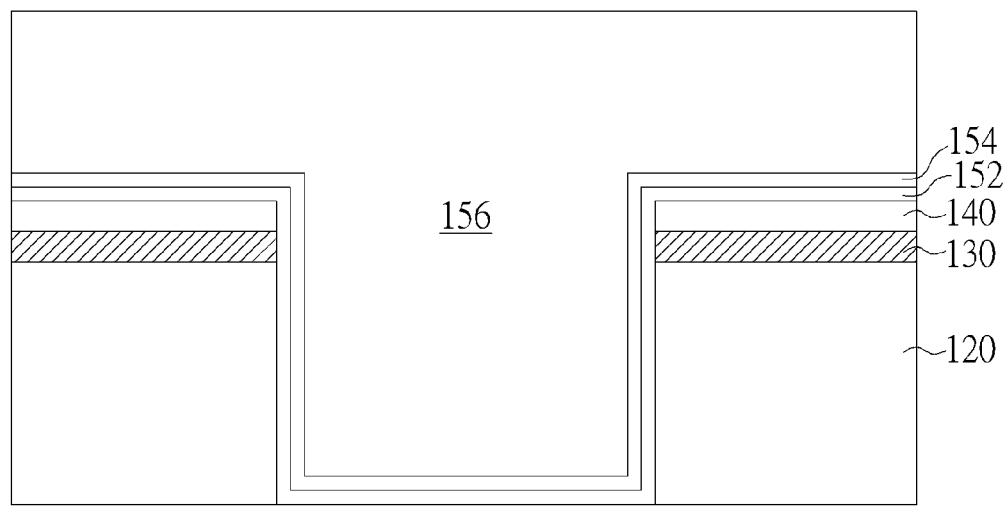

Please refer to FIG. 4. Next, a metal layer 156 such as a Cu layer is formed in the opening 150. Specifically, the opening 150 is filled up with a conductive material including the metal layer 156, the seed layer 154 and the diffusion barrier layer 152.

Figure 5:
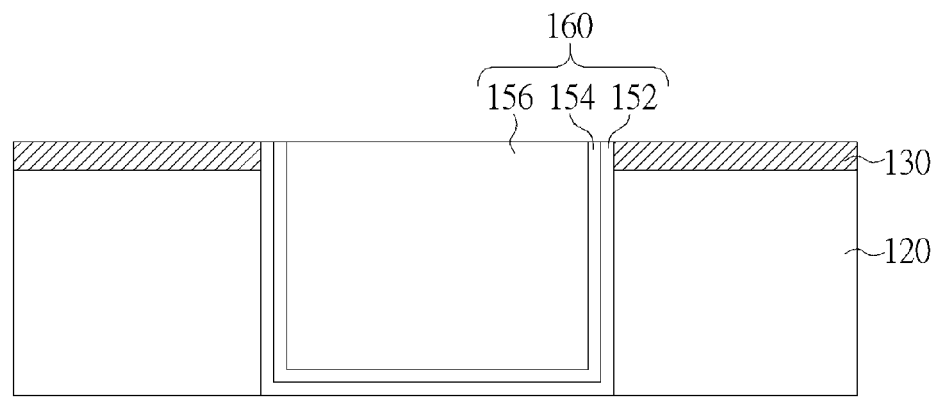

Please refer to FIG. 5. After forming the metal layer 156, a planarization process such as a chemical mechanical planarization (CMP) is performed to planarize the first substrate 100. As shown in FIG. 5, consequently the superfluous conductive material (including the metal layer 156, the seed layer 154 and the diffusion barrier layer 152) and the patterned hard mask layer 140 are removed and thus a first conductive pad 160 is formed in the first SiCN layer 130 and the first dielectric layer 120. Accordingly, the first conductive pad 160 includes the diffusion barrier layer 152, the seed layer 154 and the metal layer 156. More important, the first SiCN layer 130 is exposed after the planarization process.

Figure 6:
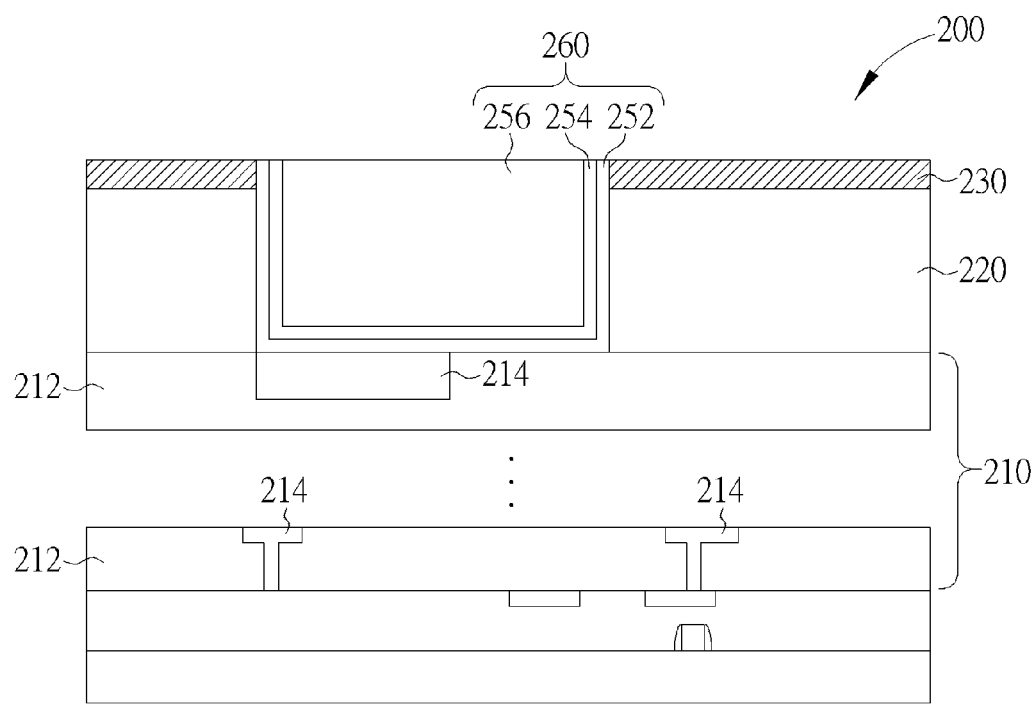

Please refer to FIG. 6. Subsequently, a second substrate 200 is provided. The second substrate 200 can include integrated circuit(s), which further includes a plurality of active and passive devices (not shown) fabricated by FEOL process. In some embodiments of the present invention, the second substrate 200 can include a CMOS image sensor (CIS) substrate, or a backside illumination (BSI) image sensor substrate, but not limited to. It is noteworthy that in some embodiments of the present invention, the first substrate 100 and the second substrate 200 may be formed using same manufacturing processes and materials, and unless noted otherwise, reference numerals "2xx" in FIG. 6 refer to the same elements/components as reference numerals "1xx" in FIGS. 1-5. Consequently, the second substrate 200 includes a second interconnection structure 210, a second dielectric layer 220 formed on the second interconnection structure 210, a second SiCN layer 230 formed on the second dielectric layer 220, and at least a second conductive pad 260 formed in the second dielectric layer 220 and the second SiCN layer 230. A thickness of the second SiCN layer 230 can be between 300 Å and 2000 Å. Furthermore, the second dielectric layer 220 includes silicon oxide material as mentioned above, and the second conductive pad 260 includes at least a diffusion barrier layer 252, a seed layer 254 and a metal layer 256 as mentioned above.

Figure 7:
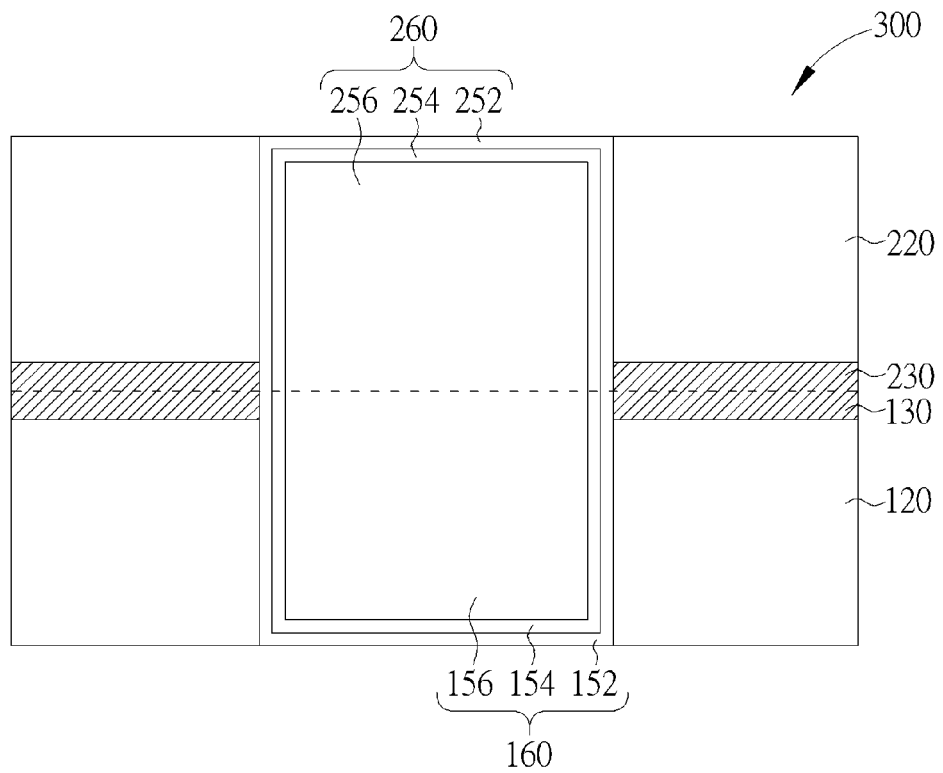

Please refer to FIG. 7. It is noteworthy that FIG. 7 is an enlarged view of the first dielectric layer 120, the first SiCN layer 130 and the first conductive pad 160, and also an enlarged view of the second dielectric layer 220, the second SiCN layer 230 and the second conductive pad 260. As mentioned above, though other elements shown in FIGS. 1 and 6 are omitted in FIG. 7, those skilled in the art would easily realize the relationships between those elements according to FIGS. 1 and 6. As shown in FIG. 7, a hybrid bonding is performed to bond the first substrate 100 and the second substrate 200. In the hybrid bonding approach, the first conductive pad 160 and the second conductive pad 260 are aligned and bonded using direct metal-to-metal bonding. Those skilled in the art would easily realize that direct metal-to-metal bonding mean that the two conductive pads are metallurgically bonded together at a common interface without the intervention of a layer of alloy. At the same time, the first SiCN layer 130 and the second SiCN layer 230 are aligned and bonded using dielectric-to-dielectric bonding. Subsequently, annealing may be performed to enhance the bonding strength between the first substrate 100 and the second substrate 200.

Accordingly, a bonded semiconductor structure is provided. The bonded semiconductor structure includes the first substrate 100, which includes the first interconnection structure 110 (shown in FIG. 1), the first dielectric layer 120, the first SiCN layer 130, and the first conductive pad 160. The bonded semiconductor structure also includes the second substrate 200, which includes the second interconnection structure 210 (shown in FIG. 6), the second dielectric layer 220, the second SiCN layer 230, and the second conductive pad 260. More important, the first conductive pad 160 physically contacts the second conductive pad 260 while the first SiCN layer 130 physically contacts the second SiCN layer 230. It is noteworthy that as shown in FIGS. 1 and 6, since the first conductive pad 160 is electrically connected to the first interconnection structure 110 and the second conductive pad 260 is electrically connected to the second interconnection structure 210, the ICs respectively formed in the first substrate 100 and the second substrate 200 are electrically connected by bonding the first conductive pad 160 and the second conductive pad 260.

In other words, the bonded semiconductor structure includes the first substrate 100, the second substrate 200, and a bonded structure 300 formed in between the first interconnection structure 110 of the first substrate 100 and the second interconnection structure 210 of the second substrate 200. More important, the bonded structure 300 includes the first dielectric layer 120, the second dielectric layer 220, a SiCN layer 130/230 sandwiched in between the first dielectric layer 120 and the second dielectric layer 220, and a bonded conductive material 160/260 formed in the first dielectric layer 120, the SiCN layer 130/230 and the second dielectric layer 220. Furthermore, the bonded conductive material 160/260 inwardly and sequentially includes the diffusion barrier layer 152/255, the seed layer 154/254 and the metal layer 156/256. As shown in FIG. 7, since the SiCN layer 130/230 is formed by bonding the first SiCN layer 130 and the second SiCN layer 230, a thickness of the SiCN layer 130/230 may be a sum of the thickness of the first SiCN layer 130 and the thickness of the second SiCN layer 230. For example but not limited to, the thickness of the SiCN layer 130/230 can be between 600 Å and 4000 Å. As mentioned above, the bonded conductive material 160/260 is obtained by bonding the first conductive pad 160 and the second conductive pad 260, therefore the bonded conductive material 160/260 is electrically connected to the first interconnection structure 110 and the second interconnection structure 210.

According to the preferred embodiment provided by the present invention, the bonded semiconductor structure is obtained by performing the hybrid bonding. Therefore, the first conductive pad 160 and the second conductive pad 260 are directly bonded while the first SiCN layer 130 and the second SiCN layer 230 are directly bonded. Since SiCN is a material that significantly prevents metal diffusion, the leakage of the bonded semiconductor structure is reduced.

Figure 8:
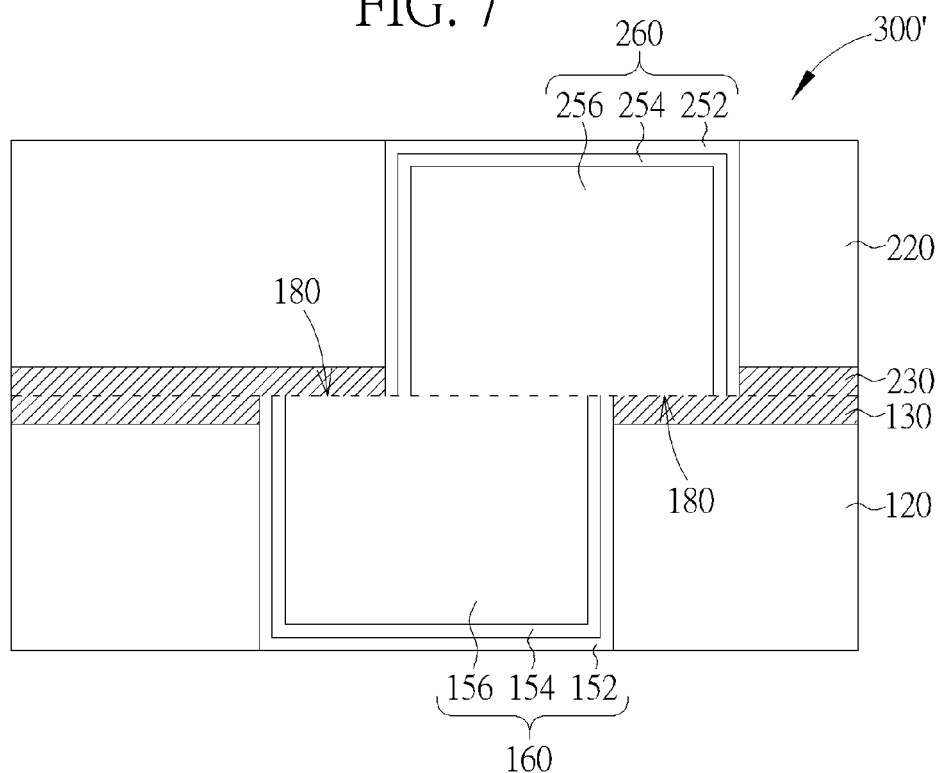
FIG. 8 is a schematic drawing illustrating a bonded semiconductor structure provided by a modification of the present invention.

Please refer to FIG. 8, which is a schematic drawing illustrating a modification to the preferred embodiments of the present invention. It is noteworthy that elements the same in the modification and the abovementioned preferred embodiment are designated by the same numerals, and thus those details are omitted in the interest of brevity. As mentioned above, before hybrid bonding the first substrate 100 and the second substrate 200, the first substrate 100 and the second substrate 200 are aligned. However, alignments are not always precise and accurate, and sometimes misalignment occurs. Therefore, it is found according to the bonded semiconductor structure 300' provided by the modification, the bonded conductive material 160/260, particularly the metal layers 156/256 physically contacts the SiCN layer 130/230 to form a conductive-to-SiCN interface 180 after hybrid bonding. Specifically, the metal layer 156 of the first conductive pad 160 physically contacts the second SiCN layer 230, and the metal layer 256 of the second conductive pad 260 physically contacts the first SiCN layer 130 to form the conductive-to-SiCN interfaces 180, respectively.

According to the bonded semiconductor structure 300' provided by the modification, though misalignment occurs, the SiCN layer 130/230 still significantly prevents metal diffusion resulting from the misalignment. In other words, the conductive-to-SiCN interfaces 180 formed in between the first conductive pad 160 and the second conductive pad 260 due to misalignment still prevent leakage.

Figure 9:
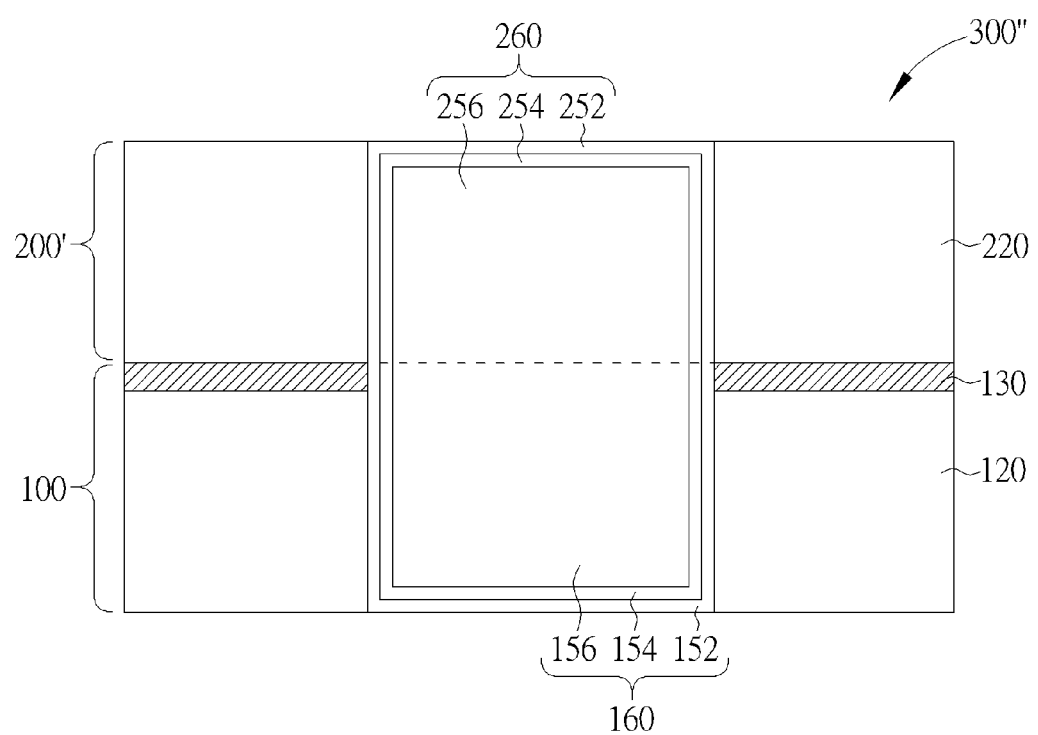
FIG. 9 is a schematic drawing illustrating a bonded semiconductor structure provided by another modification of the present invention.

Please refer to FIG. 9, which is a schematic drawing illustrating another modification to the preferred embodiments of the present invention. It is noteworthy that elements the same in the modification and the abovementioned preferred embodiment are designated by the same numerals, and thus those details are omitted in the interest of brevity. According to the modification, the first substrate 100 includes the first interconnection structure 110 (shown in FIG. 1), the first dielectric layer 120 formed on the first interconnection structure 110, the first SiCN layer 130 formed on the first dielectric layer 120, and the first conductive pad 160 formed in the first dielectric layer 120 and the first SiCN layer 130. Different from the aforementioned embodiment and modification, the second substrate 200' includes a second interconnection structure 210 (shown in FIG. 6), the second dielectric layer 220 and the second conductive pad 260 formed in the second dielectric layer 220. Therefore, during hybrid bonding the first substrate 100 and the second substrate 200', the first conductive pad 160 and the second conductive pad 260 are bonded by direct metal-to-metal bonding while the first SiCN layer 130 and the second dielectric layer 220 are bonded by dielectric-to-dielectric bonding. In other words, the modification provides a bonded semiconductor structure 300" of which the first SiCN layer 130 physically contacts the second dielectric layer 220 as shown in FIG. 9.

According to the method for forming the bonded semiconductor structure provided by the present invention, the SiCN layer must be remained and exposed after planarizing the first substrate. Therefore the bonding result is improved and, more important, leakage of the bonded conductive material, which is formed by the first conductive pad and the second conductive pad, is significantly reduced by the SiCN layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a bonded semiconductor structure, comprising:
   providing a first substrate comprising a first interconnection structure, a first dielectric layer, a first SiCN layer, and a patterned hard mask sequentially formed thereon;
   forming at least an opening in the first SiCN layer and the first dielectric layer through the patterned hard mask layer;
   filling the opening with a conductive material;
   planarizing the first substrate to remove the patterned hard mask layer and superfluous conductive material to form a first conductive pad in the first SiCN layer and the first dielectric layer and to expose the first SiCN layer;
   providing a second substrate comprising a second interconnection structure, a second dielectric layer formed on the second interconnection structure, and at least a second conductive pad formed in the second dielectric layer; and
   bonding the first substrate and the second substrate with the first conductive pad physically contacting the second conductive pad, and the first SiCN layer physically contacting the second dielectric layer.

2. The method for forming the bonded semiconductor structure according to claim 1, wherein the step of filling opening with the conductive material further comprises sequentially forming a diffusion barrier layer, a seed layer, and a metal layer in the opening.

3. The method for forming the bonded semiconductor structure according to claim 1, wherein a thickness of the first SiCN layer is between 300 Å and 2000 Å.

4. The method for forming the bonded semiconductor structure according to claim 1, wherein the first dielectric layer and the second dielectric layer comprise a silicon oxide material.

5. A bonded semiconductor structure comprising:
   a first substrate comprising a first interconnection structure, a first dielectric layer, and a silicon carbon nitride (SiCN) layer sequentially stacked thereon, and at least a first conductive pad being formed in the first dielectric layer and the SiCN layer; and
   a second substrate comprising a second interconnection structure, a second dielectric layer stacked thereon, and at least a second conductive pad being formed in the second dielectric layer, wherein the first conductive pad physically contacts the second conductive pad, and the SiCN layer on the first substrate physically contacts the second dielectric layer on the second substrate.

6. The bonded semiconductor structure according to claim 5, wherein a thickness of the SiCN layer is between 300 angstroms (Å) and 2000 Å.

7. The bonded semiconductor structure according to claim 5, wherein the first conductive pad is electrically connected to the first interconnection structure and the second conductive pad is electrically connected to the second interconnection structure.

8. The bonded semiconductor structure according to claim 5, wherein the first dielectric layer and the second dielectric layer comprise a silicon oxide material, respectively.

9. The bonded semiconductor structure according to claim 5, wherein the first conductive pad and the second conductive pad comprise at least a diffusion barrier layer, a seed layer, and a metal layer, respectively.

* * * * *